(12) United States Patent
Pappu et al.

(10) Patent No.: US 10,192,633 B2
(45) Date of Patent: Jan. 29, 2019

(54) LOW COST INBUILT DETERMINISTIC TESTER FOR SOC TESTING

(71) Applicant: Intel Corporation, Santa Clara, CA (US)

(72) Inventors: Lakshminarayana Pappu, Folsom, CA (US); Timothy J. Callahan, Hillsboro, OR (US); Tomer Levy, Tel Aviv (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/057,685

(22) Filed: Mar. 1, 2016

(65) Prior Publication Data

US 2017/0256325 A1    Sep. 7, 2017

(51) Int. Cl.
| | |
|---|---|
| *G11C 29/00* | (2006.01) |
| *G11C 29/38* | (2006.01) |
| *G06F 12/10* | (2016.01) |
| *G06F 13/40* | (2006.01) |
| *G11C 29/44* | (2006.01) |
| *G11C 29/14* | (2006.01) |
| *G11C 29/16* | (2006.01) |
| *G11C 29/40* | (2006.01) |
| *G11C 29/04* | (2006.01) |

(52) U.S. Cl.
CPC .............. *G11C 29/38* (2013.01); *G06F 12/10* (2013.01); *G06F 13/4022* (2013.01); *G11C 29/14* (2013.01); *G11C 29/16* (2013.01); *G11C 29/40* (2013.01); *G11C 29/44* (2013.01); *G06F 2212/65* (2013.01); *G06F 2213/0038* (2013.01); *G11C 2029/0401* (2013.01)

(58) Field of Classification Search
None
See application file for complete search history.

(56) References Cited

U.S. PATENT DOCUMENTS

| | | | | |
|---|---|---|---|---|
| 6,003,142 A | * | 12/1999 | Mori | G06F 11/2236 714/30 |
| 6,101,578 A | * | 8/2000 | Patwardhan | G06F 9/3802 711/125 |
| 7,536,267 B2 | * | 5/2009 | Zimmerman | G11C 5/04 702/117 |
| 8,566,508 B2 | * | 10/2013 | Borchers | G06F 3/0613 711/103 |

(Continued)

FOREIGN PATENT DOCUMENTS

KR    10-2000-0029368    5/2000

OTHER PUBLICATIONS

PCT International Search Report and Written Opinion for PCT/US2017/012857, dated Apr. 19, 2017, 15 pages.

(Continued)

*Primary Examiner* — Daniel F. McMahon
(74) *Attorney, Agent, or Firm* — Schwabe, Williamson & Wyatt P.C.

(57) ABSTRACT

A method and system for high speed on chip testing for quality assurance. A multi-core system on a chip has a plurality of processing cores. The cores act as transaction agents with an auto-response unit fabricated on the chip at a chip boundary, the auto-response unit to provide a deterministic return value based on a logical address of a received read request.

14 Claims, 4 Drawing Sheets

(56) References Cited

U.S. PATENT DOCUMENTS

| | | | |
|---|---|---|---|
| 8,868,992 B2* | 10/2014 | Spry | G11C 29/08 |
| | | | 714/738 |
| 2003/0005380 A1 | 1/2003 | Nguyen et al. | |
| 2007/0168796 A1 | 7/2007 | Martin et al. | |
| 2009/0083594 A1 | 3/2009 | Chelstrom et al. | |
| 2012/0272112 A1* | 10/2012 | Oh | H01L 23/481 |
| | | | 714/727 |
| 2013/0138870 A1* | 5/2013 | Yoon | G11C 11/5621 |
| | | | 711/103 |
| 2015/0316605 A1 | 11/2015 | Deutsch et al. | |

OTHER PUBLICATIONS

International Preliminary Report on Patentablity for International Patent Application No. PCT/US17/12857, dated Sep. 13, 2018, 12 pages.

\* cited by examiner

LOW COST INBUILT DETERMINISTIC TESTER FOR SOC TESTING

BACKGROUND

FIELD

Embodiments of the invention relate to system on a chip testing. More specifically, embodiments relate to use of an auto-response unit fabricated on a chip to perform on-chip testing.

BACKGROUND

Testing of systems on a chip is essentially for quality assurance. As systems have become more complex and faster, effective testing has become more difficult and more expensive. Generally, testing involves using external testers to analyze data exchanges with an external memory. Unfortunately, because of the increasing disparity between tester speeds and double data rate (DDR) memory exchanges, existing techniques fail to provide the desired quality assurance.

Stretch mode, one traditional technique in which the data strobe time is stretched with a ratio equivalent to the speed ratio of the DDR to the tester speed, become entirely impractical as speeds increase. The testing interface has a much slower speed than is desired, often with a stretch factor of four or more. As the stretch factor increases, so does the command bubble duration. The logic to handle the DDR input/output (I/O) is both complex and intrusive. Moreover, for stretch mode to work for design for manufacturability (DFX) tests, enormous tuning of the tester is required. Such tuning has been found impractical to real-world applications.

A second historical testing option is write data always response (WDAR) mode. This mechanism requires 128 cache lines of additional memory for data. Often, this amount of memory does not exist in products to be tested. Moreover, WDAR has a huge time impact resulting from the need to fill the memory with known data before starting the test. Finally, it is not possible to calculate the expected response on the fly. Therefore, the WDAR test writer must perform pre-silicon simulation and compare with post-silicon results. Often, mismatches occur between the signatures calculated from the simulation and those that exist in the actual silicon.

BRIEF DESCRIPTION OF THE DRAWINGS

Embodiments of the invention are illustrated by way of example and not by way of limitation in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1:
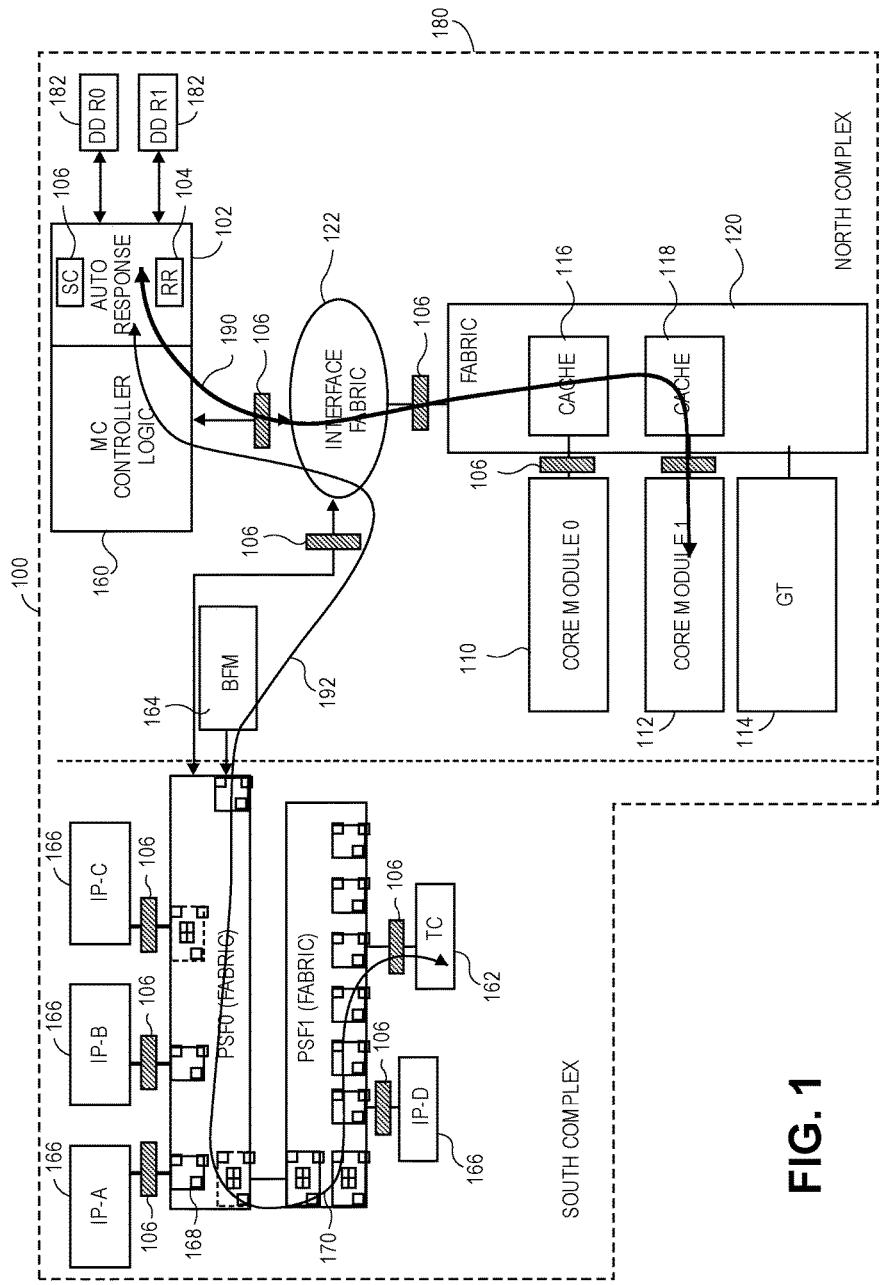
FIG. 1 is a block diagram a system according to one embodiment of the invention.

FIG. 1 is a block diagram a system according to one embodiment of the invention. Auto-response unit 102 is fabricated on a chip 100 having a chip boundary 180. Auto-response unit 102 is preferably fabricated near the chip boundary 180 to provide effective testing for chip devices further from the boundary than itself. As explained below, the auto responder effectively tests all components of the chip in the signal path of the read and write transactions issued during a test regimen. In one embodiment, auto-response unit 102 is coupled between a memory controller 160 and the memory ports 182 through which the memory controller 160 accesses off-chip memory (not shown). In this arrangement the auto response unit can provide effective testing of the memory controller 160 in addition to other chip components.

Auto-response unit 102 includes a signature collector 106 that non-deterministically collects signatures of transactions received at the auto-response unit 102. In some embodiments, signature collector 106 may collect only signatures of write transactions. In other embodiments, signature collector 106 may collect signatures of both read and write transactions. Auto-response unit 102 also includes a read-response module 104 to provide an automatic deterministic response to read requests received by the auto-response unit 102. Auto-response unit 102 is discussed more detail below with reference to FIG. 2.

Chip 100 has fabricated thereon multiple core modules 110, 112. While two core modules are shown, an arbitrarily large number of core modules may be fabricated on a chip. As such, an arbitrary number of core modules are deemed within the scope and contemplation of various embodiments of the invention. Each core module is associated with a cache memory. Here, core module 110 is associated with cache 116, and core module 112 is associated with cache 118. If more cores are present correspondingly more caches will be present. A Graphic technologies module 114 may also be fabricated on chip 100. Graphic technology module 114 may include a graphics processing unit (GPU) and any other components desired for graphics support with in the system. In some embodiments an analogous auto response unit may be use to test the GPU subsystem by fabrication it at the chip boundary between a graphics controller (not shown) and the graphics input/output interface (not shown).

Chip 100 provides a fabric 120 through which the core modules 110, 112 communicate and can send read and write requests via an interface fabric 122 to memory controller 160. A bus functional module 164 is provided to facilitate communication between the north complex of chip 100 and the south complex. The south complex may include a plurality of fabrics 168 and 170 that provide network connectivity through IP ports 166. A test controller 162 may also be fabricated in the south complex. Test controller 162 can act as a transaction agent, sending read and write transactions through the local fabrics 168, 170 and the interface fabric 122 to memory controller 160.

The memory controller 160 receives a transaction either from one of the core modules, e.g., transaction 190, or from the test controller, e.g., transaction 192, and translates the logical address specified in the transaction to a physical address, which is then forwarded through the auto-response unit 102. If the auto-response unit 102 is not in a test mode, it takes no action and the transaction is conducted in the normal manner of the DDR interface 182. But, if the auto-response unit is in a test mode, it will handle the transaction as discussed more fully with reference to FIG. 2. Notably, signature collectors 106 can be distributed at different branch points around the system to improve localization of faults identified in the course of a test.

Figure 2:
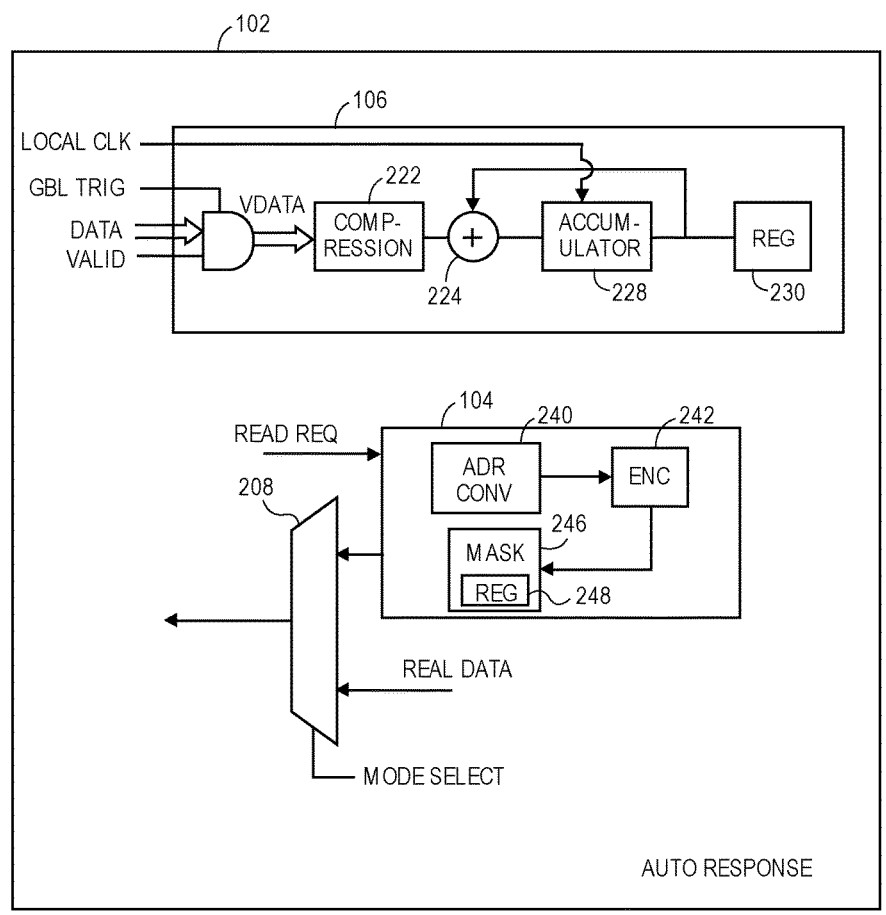
FIG. 2 is a more detailed block diagram of the auto-response unit according to one embodiment of the invention.

FIG. 2 is a more detailed block diagram of the auto-response unit according to one embodiment of the invention. As noted with reference to FIG. 1, auto-response unit 102 includes a signature collector 106. In one embodiment, signature collector 106 uses AND logic with a global trigger to ensure valid data has passed to a compression unit 222. A summer 224 adds compressed data is to any previously accumulated signatures creating a running non-deterministic checksum. An accumulator 228 feeds back the result to the summer for a subsequent transaction while latching the present value and also storing it in a register storage 230. This construction results in a non-deterministic signature accumulation, which is agnostic to the order of the transaction's arrival, high speed, and provides an easy checksum for comparison with an expect value for an easy pass fail determination. When a test is complete, the testing transaction agent need only read register file 230 and compare it with its expected value to determine whether the test has passed or failed. In one embodiment, signature collection is only performed for write transactions. In other embodiments, signature collection is performed on both read and write transactions. Generally, the physical address for the transaction forms part of the checksum and during the post test comparison the transactions agent use a expected value based on the physical rather than the logical addresses. The use of the physical address is driven by the desire auto response unit as deep in the signal path as possible to the greatest coverage during testing. The logical to physical address conversion by the memory controller occurs quite close to the chip boundary, by placing the auto response unit later in the path, excellent chip coverage is achieved.

Auto-response unit 102 includes read-response unit 104, which receives read requests from a memory controller when the system is under test. In one embodiment, read-response unit 104 includes an address conversion module 240 that converts the physical address supplied by the memory controller to a logical address that would have been sent by the transaction agent. An example of a logical address conversion is shown in Table 1 below.

TABLE 1

DRAM to system address conversion assuming DDR4 16 GB, x8 full occupancy (all ranks in all channels), no interleaving and no remap

| DRAM Address | System Address |
|---|---|
| Row[16:0] | '36:20 |
| Bank[1] | 19 |
| Rank[1] | 18 |
| Bank[0] | 17 |
| Rank[0] | 16 |
| Group[1] | 15 |
| Column[9:3] | '14:8 |
| Group[0] | 7 |
| Channel | 6 |
| Column[2:0] | '5:3 |

This conversion is based on a system using DDR 4 16 GB×8 full occupancy (all ranks and all channels) with no interleaving, no remap and no error correction codes. Appropriate mapping may be employed for whatever system memory population is intended. This conversion is required because the memory controller convert the logical address receive with the transaction to a physical address and since the auto response unit is after the memory controller in the signal path, it only receives the physical address. Some embodiments of the invention could place the auto response unit before the memory controller in the signal path. Those embodiment would avoid the need for physical to logical address conversion in the auto response unit, but would not provide effective testing of the memory controller.

The converted address (that is, the logical address) is then fed into an encoder 242, which applies a set of equations to generate a deterministic value corresponding to that logical address. In one embodiment, the encoder 242 generates 128 bits of data response to be returned to the transaction agent. Each data bit generation involves a unique logic equation. For example:

Data_response[0]=$f$(address bits 18,25,11)

Data_response[1]=$f$(address bits 12,23,11)

Data_response[2]=$f$(address bits 19,37,11)

Data_response[3]=$f$(address bits 30,15,9)

Data_response[4]=$f$(address bits 13,25,7)

Data_response[5]=$f$(address bits 28,16,10)

Data_response[6]=$f$(address bits 20,6,11)

Data_response[7]=$f$(address bits 33,19,10)

Data_response[8]=$f$(address bits 16,32,11)

Data_response[9]=$f$(address bits 21,38,9)

Data_response[10]=$f$(address bits 36,14,6)

Data_response[11]=$f$(address bits 22,18,10)

Data_response[12]=$f$(address bits 29,13,8)

Data_response[13]=$f$(address bits 20,29,6)

Data_response[14]=$f$(address bits 23,17,7)

Data_response[15]=$f$(address bits 17,33,6)

Data_response[16]=$f$(address bits 12,26,9)

Data_response[17]=$f$(address bits 26,11,6)

Data_response[18]=$f$(address bits 21,38,7)

Data_response[19]=$f$(address bits 15,28,10)

Data_response[20]=$f$(address bits 31,16,10)

Data_response[21]=$f$(address bits 26,21,6)

Data_response[22]=$f$(address bits 15,30,7)

Data_response[23]=$f$(address bits 35,20,7)

Data_response[24]=$f$(address bits 18,27,9)

Data_response[25]=$f$(address bits 14,26,10)

Data_response[26]=$f$(address bits 15,13,8)

Data_response[27]=$f$(address bits 35,12,8)

Data_response[28]=$f$(address bits 14,24,9)

Data_response[29]=$f$(address bits 17,28,9)

Data_response[30]=$f$(address bits 34,9,10)

Data_response[31]=*f*(address bits 18,22,6)

Data_response[32]=*f*(address bits 28,17,8)

Data_response[33]=*f*(address bits 36,15,11)

Data_response[34]=*f*(address bits 27,14,10)

Data_response[35]=*f*(address bits 32,9,10)

Data_response[36]=*f*(address bits 19,22,9)

Data_response[37]=*f*(address bits 18,38,7)

Data_response[38]=*f*(address bits 26,18,11)

Data_response[39]=*f*(address bits 31,19,6)

Data_response[40]=*f*(address bits 14,37,8)

Data_response[41]=*f*(address bits 29,12,7)

Data_response[42]=*f*(address bits 38,13,9)

Data_response[43]=*f*(address bits 18,30,6)

Data_response[44]=*f*(address bits 13,29,8)

Data_response[45]=*f*(address bits 28,16,8)

Data_response[46]=*f*(address bits 16,28,8)

Data_response[47]=*f*(address bits 25,21,11)

Data_response[48]=*f*(address bits 21,13,6)

Data_response[49]=*f*(address bits 18,25,7)

Data_response[50]=*f*(address bits 23,21,8)

Data_response[51]=*f*(address bits 31,20,9)

Data_response[52]=*f*(address bits 15,32,10)

Data_response[53]=*f*(address bits 17,36,11)

Data_response[54]=*f*(address bits 20,35,8)

Data_response[55]=*f*(address bits 14,22,11)

Data_response[56]=*f*(address bits 21,34,9)

Data_response[57]=*f*(address bits 32,19,10)

Data_response[58]=*f*(address bits 38,20,10)

Data_response[59]=*f*(address bits 24,16,8)

Data_response[60]=*f*(address bits 37,13,10)

Data_response[61]=*f*(address bits 29,6,11)

Data_response[62]=*f*(address bits 15,31,6)

Data_response[63]=*f*(address bits 17,33,9)

Data_response[64]=*f*(address bits 22,18,10)

Data_response[65]=*f*(address bits 14,32,8)

Data_response[66]=*f*(address bits 32,16,7)

Data_response[67]=*f*(address bits 37,11,7)

Data_response[68]=*f*(address bits 31,7,8)

Data_response[69]=*f*(address bits 17,34,9)

Data_response[70]=*f*(address bits 22,20,6)

Data_response[71]=*f*(address bits 31,15,11)

Data_response[72]=*f*(address bits 13,36,11)

Data_response[73]=*f*(address bits 25,18,7)

Data_response[74]=*f*(address bits 14,28,6)

Data_response[75]=*f*(address bits 21,26,10)

Data_response[76]=*f*(address bits 27,13,8)

Data_response[77]=*f*(address bits 24,12,6)

Data_response[78]=*f*(address bits 22,16,9)

Data_response[79]=*f*(address bits 29,7,8)

Data_response[80]=*f*(address bits 20,30,9)

Data_response[81]=*f*(address bits 23,14,6)

Data_response[82]=*f*(address bits 34,17,11)

Data_response[83]=*f*(address bits 38,19,8)

Data_response[84]=*f*(address bits 27,21,10)

Data_response[85]=*f*(address bits 38,12,6)

Data_response[86]=*f*(address bits 14,33,8)

Data_response[87]=*f*(address bits 27,21,7)

Data_response[88]=*f*(address bits 15,37,7)

Data_response[89]=*f*(address bits 12,29,11)

Data_response[90]=*f*(address bits 35,6,8)

Data_response[91]=*f*(address bits 18,24,10)

Data_response[92]=*f*(address bits 35,20,7)

Data_response[93]=*f*(address bits 33,16,9)

Data_response[94]=*f*(address bits 19,21,10)

Data_response[95]=*f*(address bits 15,33,10)

Data_response[96]=*f*(address bits 15,23,11)

Data_response[97]=*f*(address bits 12,24,10)

Data_response[98]=*f*(address bits 16,27,8)

Data_response[99]=*f*(address bits 19,17,11)

Data_response[100]=*f*(address bits 17,33,8)

Data_response[101]=*f*(address bits 27,8,7)

Data_response[102]=*f*(address bits 37,7,8)

Data_response[103]=*f*(address bits 38,18,6)

Data_response[104]=*f*(address bits 18,37,8)

Data_response[105]=f(address bits 12,14,7)

Data_response[106]=f(address bits 34,17,11)

Data_response[107]=f(address bits 21,34,6)

Data_response[108]=f(address bits 36,20,10)

Data_response[109]=f(address bits 32,19,6)

Data_response[110]=f(address bits 23,19,9)

Data_response[111]=f(address bits 18,24,11)

Data_response[112]=f(address bits 34,14,9)

Data_response[113]=f(address bits 35,15,6)

Data_response[114]=f(address bits 25,18,10)

Data_response[115]=f(address bits 13,22,6)

Data_response[116]=f(address bits 16,37,10)

Data_response[117]=f(address bits 20,29,8)

Data_response[118]=f(address bits 19,20,8)

Data_response[119]=f(address bits 26,13,10)

Data_response[120]=f(address bits 35,12,7)

Data_response[121]=f(address bits 16,38,10)

Data_response[122]=f(address bits 14,31,11)

Data_response[123]=f(address bits 28,11,9)

Data_response[124]=f(address bits 36,21,11)

Data_response[125]=f(address bits 27,13,10)

Data_response[126]=f(address bits 17,30,9)

Data_response[127]=f(address bits 30,15,6)

In one embodiment, function f could be an XOR function. However, more complex equations may alternatively be used. The above example is only one possible function set, generally, it is desirable to choose the function f to minimize the aliasing between generated data bits. Simulations may be conducted to ensure sufficient deterministic randomness in the return data. Any set of functions that provide suitable deterministic randomness could be used. The deterministic value generated by the encoder 242 may then be fed into a masking unit 246, which may apply a mask to change or otherwise ensure that one or more bits of the deterministic value resolve to a known value. This may be important where a particular bit has been found to be the source of errors and it is desirable to test if errors exist elsewhere in the system. A register file 248 may hold various masks for this purpose. It is of course possible that the masking logic 246 will leave the original deterministic value unchanged. The masked or unmasked value is then returned to the transaction agent. The auto-response unit 102 includes a mode selector 208 which ensures that the deterministic value is fed back only when the system is in test mode and real data, that is, functional data from the memory, is returned from read requests when test mode is not selected.

Referring again to FIG. 1, after a series of transactions e.g. 190, 192 conducted as part of a test, the transaction agent 110, 162 respectively, verifies the check sum of the collected signatures and confirms that the read response values have match expected values. It both are true, the logic in the signal path of the transaction is deem to be validated and the chip can be accepted as meeting specifications.

Figure 3:
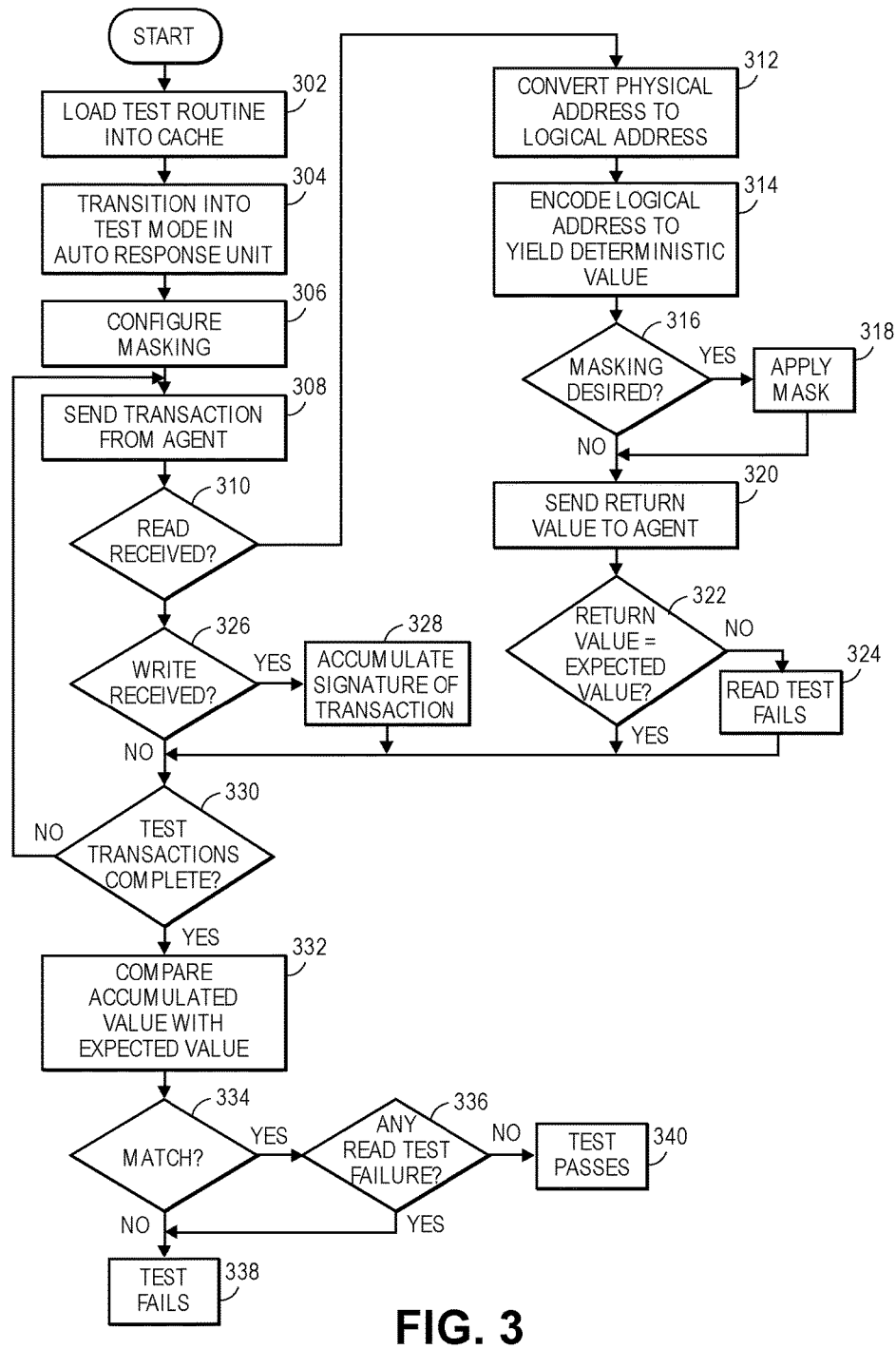
FIG. 3 is a flow diagram of operation of a system according to one embodiment of the invention.

FIG. 3 is a flow diagram of operation in a system according to one embodiment of the invention. At block 302, a test routine is loaded into the cache of a transaction agent. This can be done with low speed low cost test equipment. At block 304, the agent directs the auto-response unit 102 to transition into test mode. The transaction agent configures any desired masking in the auto-response unit 102 at block 306. At block 308, the transaction agent sends a transaction directed towards the off chip memory. At block 310, a determination is made whether the transaction is a read. If a read has been received, the auto-response unit 102 converts the physical address to a logical address (that is, the physical address received from the memory controller into a logical address that is used by the transaction agent). At block 314, the auto-response unit 102 encodes the logical address to yield a deterministic value. A determination is then made if masking is desired at block 316. If masking is desired, a specified mask is applied at block 318. The resultant value, with or without masking, is then returned to the transaction agent at block 320.

Generally, the transaction agent maintains a precomputed expected value for the transaction. A determination is made by the transaction agent whether the returned value is equal to the expected value at block 322. If it is not, the read test for that logical address is deemed to have failed at block 324. If at block 310, the transaction is not a read transaction, a determination is made at block 326 if a write transaction has been received. If a write transaction has been received, the signature of that transaction is accumulated as a checksum at block 328. Then, at block 330, a determination is made whether the test transactions are complete. If they are not, further transactions are sent from the agent, and the process continues. If all transactions are complete, the checksum of the accumulated values is acquired and compared with the expected value at block 332. A determination is made whether those values match at block 334. If the checksum of accumulated values matches the expected value, the write test is deemed to pass. Then, a determination is made if there have been any read test failures at block 236. If there have been no read test failures, the test passes at block 240. If not, the test fails at block 238. The test will also fail at block 238 if there is no match of the checksum from the accumulation of signatures.

Figure 4:
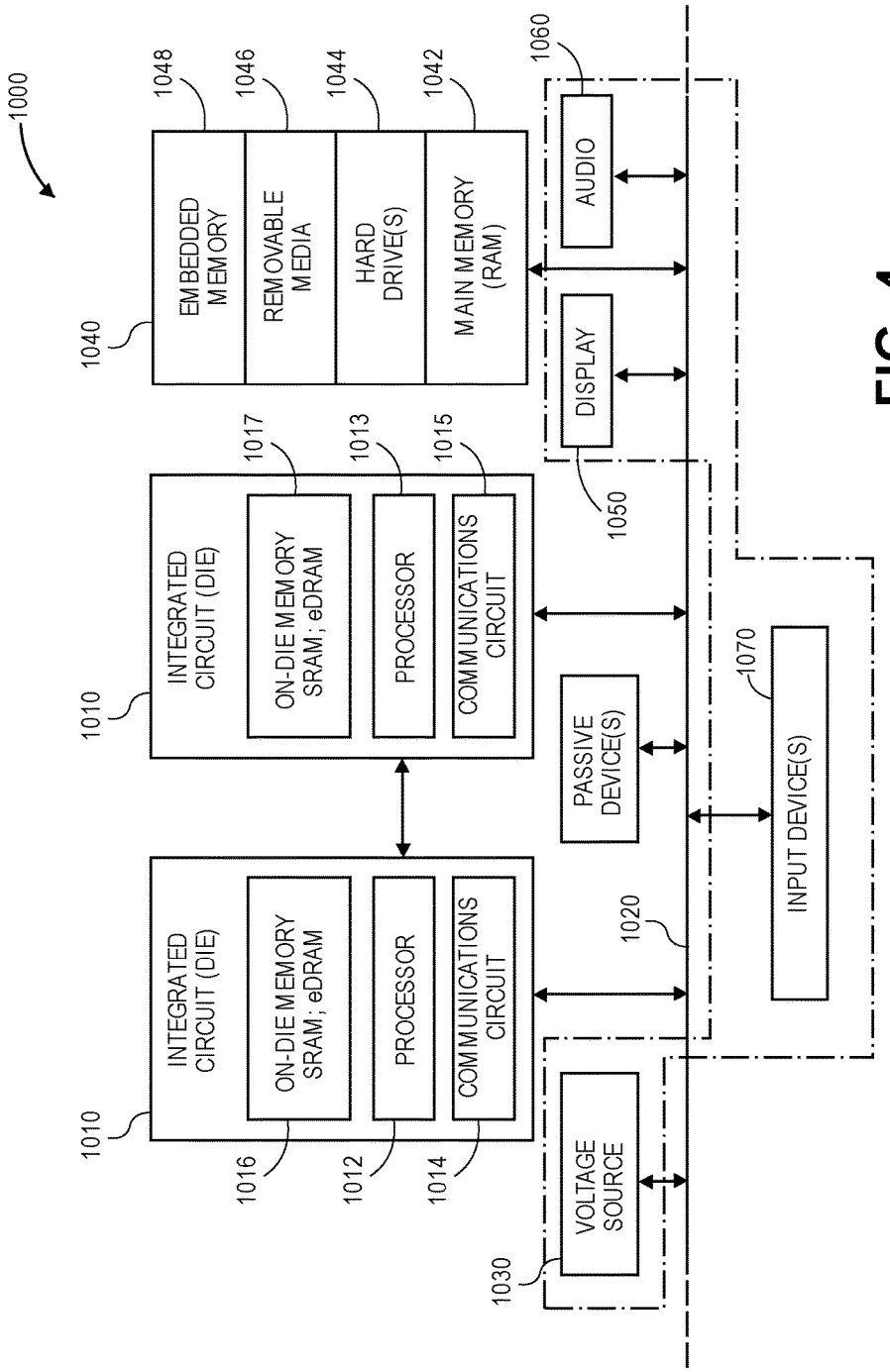
FIG. 4 is a block diagram of a system that may incorporate one embodiment of the invention.

FIG. 4 is a block diagram of a system according to one embodiment of the present invention. The computer system 1000 (also referred to as the electronic system 1000) as depicted can employ the auto response testing, according to any of the several disclosed embodiments and their equivalents as set forth in this disclosure. The computer system 1000 may be a mobile device such as a netbook computer. The computer system 1000 may be a mobile device such as a wireless smart phone. The computer system 1000 may be a desktop computer. The computer system 1000 may be a hand-held reader. The computer system 1000 may be a server system. The computer system 1000 may be a supercomputer or high-performance computing system.

In an embodiment, the electronic system 1000 is a computer system that includes a system bus 1020 to electrically couple the various components of the electronic system 1000. The system bus 1020 is a single bus or any combination of busses according to various embodiments. The electronic system 1000 includes a voltage source 1030 that provides power to the integrated circuit 1010. In some embodiments, the voltage source 1030 supplies current to the integrated circuit 1010 through the system bus 1020.

The integrated circuit 1010 is electrically coupled to the system bus 1020 and includes any circuit, or combination of circuits according to an embodiment. In an embodiment, the integrated circuit 1010 includes a processor 1012 that can be of any type. As used herein, the processor 1012 may mean any type of circuit such as, but not limited to, a microprocessor, a microcontroller, a graphics processor, a digital signal processor, or another processor. In an embodiment, the processor 1012 includes, or is coupled with, a SIP as disclosed herein. In an embodiment, SRAM embodiments are found in memory caches of the processor. Other types of circuits that can be included in the integrated circuit 1010 are a custom circuit or an application-specific integrated circuit (ASIC), such as a communications circuit 1014 for use in wireless devices such as cellular telephones, smart phones, pagers, portable computers, two-way radios, and similar electronic systems, or a communications circuit for servers. In an embodiment, the integrated circuit 1010 includes on-die memory 1016 such as static random-access memory (SRAM). In an embodiment, the integrated circuit 1010 includes embedded on-die memory 1016 such as embedded dynamic random-access memory (eDRAM).

In an embodiment, the integrated circuit 1010 is complemented with a subsequent integrated circuit 1011. Useful embodiments include a dual processor 1013 and a dual communications circuit 1015 and dual on-die memory 1017 such as SRAM. In an embodiment, the dual integrated circuit 1010 includes embedded on-die memory 1017 such as eDRAM.

In an embodiment, the electronic system 1000 also includes an external memory 1040 that in turn may include one or more memory elements suitable to the particular application, such as a main memory 1042 in the form of RAM, one or more hard drives 1044, and/or one or more drives that handle removable media 1046, such as diskettes, compact disks (CDs), digital variable disks (DVDs), flash memory drives, and other removable media known in the art. The external memory 1040 may also be embedded memory 1048 such as the first die in a die stack, according to an embodiment.

In an embodiment, the electronic system 1000 also includes a display device 1050, an audio output 1060. In an embodiment, the electronic system 1000 includes an input device such as a controller 1070 that may be a keyboard, mouse, trackball, game controller, microphone, voice-recognition device, or any other input device that inputs information into the electronic system 1000. In an embodiment, an input device 1070 is a camera. In an embodiment, an input device 1070 is a digital sound recorder. In an embodiment, an input device 1070 is a camera and a digital sound recorder. In an embodiment, an input device is a touch screen that may be part of display device 1050.

As shown herein, the integrated circuit 1010 can be implemented in a number of different embodiments, including a system on a chip (SOC), according to any of the several disclosed embodiments and their equivalents, an electronic system, a computer system, one or more methods of fabricating an integrated circuit, and one or more methods of fabricating an electronic assembly that includes a SOC, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a micro-electronic die embedded in a processor mounting substrate according to any of the several disclosed SIP embodiments and their equivalents. A foundation substrate may be included, as represented by the dashed line of FIG. 4. Passive devices may also be included, as is also depicted in FIG. 4.

The following examples pertain to further embodiments. The various features of the different embodiments may be variously combined with some features included and others excluded to suit a variety of different applications. Some embodiments pertain multi-core system on a chip having at least a first processing core and a second processing fabricated on a chip. An auto-response unit is also fabricated on the chip at a chip boundary. The auto-response unit is to provide a deterministic return value based on a logical address of a received read request.

In further embodiments, the multi-core system has a memory controller fabricated on the chip and the auto-response unit resides in a signal path between the memory controller and the chip boundary.8

In further embodiments, the auto-response unit includes a converter to convert a physical address to a logical address and an encoder to deterministically encode the return value based on the logical address.

In further embodiments, multi-core system has an accumulator to non-deterministically accumulate signatures of transactions received by the auto-response unit.

In further embodiments, multi-core system has a switch fabric on the chip and a controller coupled to the switch fabric. The controller acts as a transaction agent to which the auto-response unit is to respond to a read transaction with a deterministic return value.

In further embodiments, the auto-response unit has a mode selector to select between a test mode and a functional mode. The auto-response unit provides a deterministic return value only when the test mode is selected.

In further embodiments, the auto-response unit includes masking logic to mask a bit of the return value responsive to an instruction from a transaction agent.

Some embodiments pertain to a method of testing an integrated circuit by transitioning an auto-response module into a test mode. Once in test mode a read transaction is sent from a transaction agent agent. The read transaction is intercepted in the auto-response module. The auto response module sends a deterministic response to the transaction agent based on the read transaction.

In further embodiments, the method includes sending a write transaction from the processing agent, intercepting the write transaction in the auto-response module; and accumulating a non-deterministic signature of the write transaction.

In further embodiments, the method includes translating a physical address of the read transaction into a logical address of the read transaction. A set of equations are applied to the logical address to generate the deterministic response.

In further embodiments, the auto-response module resides between a memory controller and a chip boundary.

In further embodiments, the method includes applying a mask to the deterministic response to force one or more bits of the deterministic response to a known value.

Some embodiments pertain to an on-chip test component with
a mode selector to select between a test mode and a functional mode. The test component also has an encoder to encode a logical address into a deterministic return value and masking logic to mask one or more bits of the return value responsive to a signal from a transaction agent.

In further embodiments, the on-chip test component has a signature collector to store signatures of write transactions received at the test component.

In further embodiments, the masking logic comprises a register file to retain one or more masks.

In further embodiments, the on-chip test component includes response logic to send the deterministic return value to an agent that is the source of the read request.

In further embodiments, the signatures collected are non-deterministic.

In further embodiments, the signature collector includes a data compressor, an accumulator, and a register file.

Some embodiments pertain to a chip having on-chip test functionality including a transaction agent fabricated on the chip. The chip also includes means for accumulating non-deterministic signatures of write transactions from the transaction agent and means for automatically responding with a deterministic return value when a read transaction is received from the transaction agent.

In further embodiments, the chip includes means for selecting between a test mode and a functional mode.

In further embodiments, the means for automatically responding has means for encoding a logical address into a deterministic value and means for masking bits of the deterministic value.

While embodiments of the invention are discussed above in the context of flow diagrams reflecting a particular linear order, this is for convenience only. In some cases, various operations may be performed in a different order than shown or various operations may occur in parallel. It should also be recognized that some operations described with respect to one embodiment may be advantageously incorporated into another embodiment. Such incorporation is expressly contemplated.

In the foregoing specification, the invention has been described with reference to the specific embodiments thereof. It will, however, be evident that various modifications and changes can be made thereto without departing from the broader spirit and scope of the invention as set forth in the appended claims. The specification and drawings are, accordingly, to be regarded in an illustrative rather than a restrictive sense.

What is claimed is:

1. A multi-core system on a chip comprising:
a memory controller fabricated on the chip;
a first processing core fabricated on a chip;
a second processing core fabricated on the chip; and
an auto-response unit fabricated on the chip in a signal path between the memory controller and memory ports at a chip boundary, the auto-response unit comprising:
a signature collector having an accumulator to non-deterministically accumulate signatures of received transactions, the transactions comprising at least one of a write request and a read request; and
a read-response unit to receive the read requests from the memory controller to provide a deterministic return value based on a logical address of a received read request.

2. The multi-core system of claim 1, wherein the read-response unit further comprises:
a converter to convert a physical address of the read request received from the memory controller to a logical address; and
an encoder to deterministically encode the return value based on the logical address.

3. The multi-core system of claim 1, further comprising:
a switch fabric on the chip coupled to the memory controller;
wherein the auto-response unit is to respond to a read transaction from the controller with a deterministic return value.

4. The multi-core system of claim 1, wherein the auto-response unit comprises:
a mode selector to select between a test mode and a functional mode;
wherein the auto-response unit provides a deterministic return value only when the test mode is selected.

5. The multi-core system of claim 1, wherein the auto-response unit further comprises:
masking logic to mask a bit of the return value responsive to an instruction from a transaction agent.

6. A method of testing an integrated circuit, comprising:
transitioning an auto-response module into a test mode, the auto-response module being fabricated on a chip and a signal path between the memory controller and memory ports at a chip boundary;
sending a read transaction from a transaction agent;
intercepting the read transaction in the auto-response module, wherein the auto-response module non-deterministically accumulates signatures of received transactions, the transactions comprising at least one of a write request and a read request; and
sending a deterministic response to the transaction agent based on a logical address of the read transaction.

7. The method of claim 6, further comprising:
sending a write transaction from the processing agent;
intercepting the write transaction in the auto-response module; and
accumulating the non-deterministic signature of the write transaction.

8. The method of claim 6, further comprising:
translating a physical address of the read transaction into the logical address of the read transaction; and
applying a set of logic equations to the logical address to generate the deterministic response.

9. The method of claim 8, further comprising:
applying a mask to the deterministic response to force one or more bits of the deterministic response to a known value.

10. An on-chip test component, comprising:
a mode selector to select between a test mode and a functional mode;
a read-response unit to receive a read request from a memory controller of a chip when the chip is under test during the test mode, wherein the read-response unit includes an address conversion module that converts a physical address supplied by the memory controller to a logical address;
an encoder to encode the logical address of the read request into a deterministic return value;
masking logic responsive to a signal from a transaction agent to mask one or more bits of the deterministic return value to ensure that one or more bits of the deterministic value resolve to a known value; and
response logic to send the deterministic return value to an agent that is a source of the read request.

11. The on-chip test component of claim 10, further comprising a signature collector to store signatures of write transactions received at the on-chip test component.

12. The on-chip test component of claim 10, wherein the masking logic comprises a register file to retain one or more masks.

13. The on-chip test component of claim 11, wherein the stored signatures are non-deterministic.

14. The on-chip test component of claim 11, wherein the signature collector comprises:
   a data compressor;
   an accumulator; and
   a register file.

* * * * *